(12) United States Patent
Choi

(10) Patent No.: US 11,590,443 B2
(45) Date of Patent: Feb. 28, 2023

(54) SYSTEM AND METHOD FOR MAKING ELECTRET MEDIA

(71) Applicant: Clean and Science Company, Ltd., Rolling Meadows, IL (US)

(72) Inventor: Kyung-Ju Choi, Louisville, KY (US)

(73) Assignee: Clean and Science Company, Ltd., Rolling Meadows, IL (US)

(*) Notice: Subject to any disclaimer, the term of this patent is extended or adjusted under 35 U.S.C. 154(b) by 870 days.

(21) Appl. No.: 16/530,187

(22) Filed: Aug. 2, 2019

(65) Prior Publication Data
US 2021/0036216 A1   Feb. 4, 2021

(51) Int. Cl.
*B01D 46/00*   (2022.01)
*H01L 41/193*   (2006.01)

(52) U.S. Cl.
CPC ........ *B01D 46/0032* (2013.01); *H01L 41/193* (2013.01); *B01D 2239/0435* (2013.01)

(58) Field of Classification Search
CPC ... H01L 41/193; H01L 41/45; B01D 46/0032; B01D 2239/0435; B01D 2239/0622; B01D 2239/10; B01D 39/16; B29C 59/04; B29C 59/10
See application file for complete search history.

(56) References Cited

U.S. PATENT DOCUMENTS 4,375,718 A * 3/1983 Wadsworth .......... D04H 1/4374
                                                          96/99
5,610,795 A * 3/1997 Snelling ............... G03G 13/025
                                                         361/225

* cited by examiner

*Primary Examiner* — Jonathan Miller
*Assistant Examiner* — Gabriel E Gitman
(74) *Attorney, Agent, or Firm* — Witters & Associates; Steve Witters

(57) ABSTRACT

A system and method for making electret media is presently provided. The method involves placing a piezoelectric material adjacent a media and applying a mechanical stress to the piezoelectric material and thereby transferring an electric charge from the piezoelectric material to the media and making the electret media. The system is configured to place the piezoelectric material adjacent the media and to apply mechanical stress to the piezoelectric material.

21 Claims, 2 Drawing Sheets

SYSTEM AND METHOD FOR MAKING ELECTRET MEDIA

FIELD OF THE DISCLOSURE

This disclosure relates generally to systems and methods for making electret media.

BACKGROUND

The background information is believed, at the time of the filing of this patent application, to adequately provide background information for this patent application. However, the background information may not be completely applicable to the claims as originally filed in this patent application, as amended during prosecution of this patent application, and as ultimately allowed in any patent issuing from this patent application. Therefore, any statements made relating to the background information are not intended to limit the claims in any manner and should not be interpreted as limiting the claims in any manner.

A known method employed to increase filtration performance is making a filter media electret. By providing an electrostatic charge to the filter media, particulate contaminants can be trapped electrically as well as mechanically. For example, a temporary or permanent electrical charge can be imparted to a polyolefin such as polyethylene or polypropylene containing fiber. An electrostatic charge can be provided while conveying media, thus continuously making the fibrous media electret. When using fibers having a portion containing a polyolefin, polycarbonate, polyhalogenated carbon, or other charge retaining material, corona charging and hydro charging are typical methods of making the filter media electret.

It may be desired to make electret media with systems and by methods other than corona charging or hydro charging.

SUMMARY

In at least one aspect of the present disclosure, a method of making electret media is provided. The method comprises: feeding a piezoelectric material and a media configured to accept an electric charge between a first set of adjacent rollers, having an upper roller adjacent a lower roller; feeding the piezoelectric material and the media configured to accept an electric charge between a second set of adjacent rollers, having an upper roller adjacent a lower roller, wherein the second set of adjacent rollers are gap spaced from the first set of adjacent rollers; and applying a mechanical stress to the piezoelectric material and thereby transferring an electric charge from the piezoelectric material to the media and making the electret media.

In another aspect of the present disclosure, a method of making electret media comprises: placing a piezoelectric material adjacent a media and applying a mechanical stress to the piezoelectric material and thereby transferring an electric charge from the piezoelectric material to the media and making the electret media.

In a further aspect of the present disclosure, a system configured for making electret media is provided. The system has a media receiving zone configured for receiving a piezoelectric material and a media, a media exit zone configured for discharging the piezoelectric material and the media, and a media conveying zone between the media receiving zone and the media exit zone. The media conveying zone is configured to convey the piezoelectric material adjacent the media and to at least periodically contact the piezoelectric material with the media. The system also has at least one of a-c, wherein a-c are: a. an oscillator configured for applying an oscillating force to the piezoelectric material and tensioning and relaxing the piezoelectric material; b. a mover configured for moving at least one of the media receiving zone and the media exit zone closer and away from each other, shortening and lengthening the media conveying zone; and c. a rate changing apparatus configured to change the rate of at least one of the rate of the electret media being received in the receiving zone and the discharge rate of the electret media being discharged from the exit zone.

BRIEF DESCRIPTIONS OF THE DRAWINGS

The following figures, which are idealized, are not to scale and are intended to be merely illustrative of aspects of the present disclosure and non-limiting. In the drawings, like elements are depicted by like reference numerals. The drawings are briefly described as follows.

DETAILED DESCRIPTION

Figure 1:
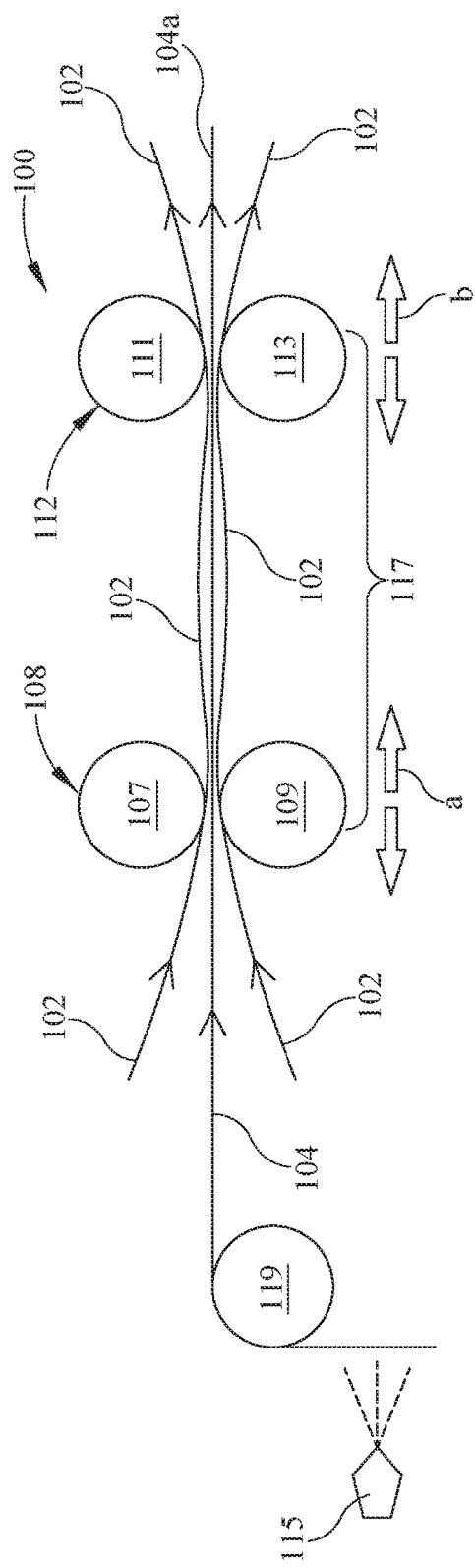
FIG. 1 is an illustration showing a system and method for making electret media.

Systems and methods for transferring an electric to media using a piezoelectric material are presently disclosed. The piezoelectric effect is understood as the linear electromechanical interaction between the mechanical and the electrical state in crystalline materials with no inversion symmetry. The piezoelectric effect is a reversible process in that materials exhibiting the direct piezoelectric effect (the internal generation of electrical charge resulting from an applied mechanical force) also exhibit the reverse piezoelectric effect (the internal generation of a mechanical strain resulting from an applied electrical field).

Many materials, both natural and synthetic, have been found to exhibit piezoelectricity. For example, naturally occurring crystals such as quartz, berlinite ($AlPO_4$), sucrose (table sugar), rochelle salt, topaz, tourmaline-group minerals, and lead titanate ($PbTiO_3$) have been found to exhibit piezoelectricity. Natural materials such as dry bone and biological materials such as tendons, silk, wood, enamel, dentin, DNA, viral proteins, and others exhibit piezoelectric properties. Synthetic crystals and semiconductors have also been determined to exhibit piezoelectric properties.

Polymers have been found to exhibit piezoelectric properties. Piezoelectric polymers also exhibit characteristics such as non-toxicity, flexibility, biocompatibility, biodegradability, low cost, and low power consumption compared to other piezo-materials such as ceramics, Piezoelectric polymers and non-toxic polymer composites may be used given their different physical properties. Examples of piezoelectric polymers include polyvinylidene fluoride (PVDF) and its copolymers, polyamides, and paralyne-C, polyimide, and polyvinylidene Chloride (PVDC). The piezoelectric effect can also be observed in polymer composites by integrating piezoelectric ceramic particles into a polymer film. A polymer does not have to be piezo-active to be an effective material for a polymer composite. For example, a piezoelectric material could be made up of an inert matrix with a separate piezo-active component.

PVDF exhibits piezoelectricity several times greater than quartz. The piezo-response observed from PVDF may be about 20-30 picocolumbs per newton (pC/N). The thermal stability of the piezoelectric effect of polymers in the PVDF family (ie. vinylidene fluoride co-poly trifluoroethylene) may go up to about 125° C. Some example applications of PVDF include pressure sensors, hydrophones, and shock wave sensors In 1969, strong piezoelectricity was observed in PVDF, with the piezoelectric coefficient of poled (placed under a strong electric field to induce a net dipole moment) thin films were found to be as large as 6-7 pC/N: 10 times larger than that observed in any other polymer. An applied mechanical stress will generate a voltage in certain materials. Conversely, an applied voltage will deformate the material—inverse piezoelectricity—ultrasound. The piezoelectric effect is a transformation of mechanical energy to electric energy. The linear electrical behavior of piezoelectric material may be shown as:

$$S_{ij}=s_{ijkl}T_{kl}+d_{kij}E_k$$

$$D_i=d_{ijk}T_{jk}+\varepsilon_{ij}E_j$$

Wherein D is the electric charge density, ε is the dielectric constant, E is the electric field strength, s is the compliance, S is the strain, T is the stress, and d is the piezoelectric effect.

The transformation of mechanical to electrical energy in PVDF may be due to a transformation of structure of the PVDF in response to mechanical stress. For example, PVDF may be transformed between alpha phase PVDF and beta phase PVDF.

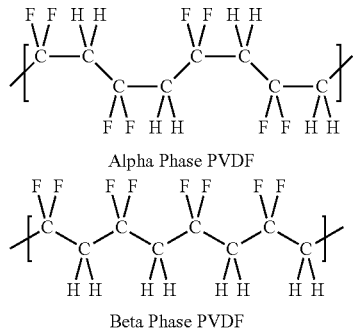

Alpha Phase PVDF

Beta Phase PVDF

Reference will now be made in detail to the present exemplary embodiments and aspects of the present invention, examples of which are illustrated in the accompanying figures.

FIG. 1 is an illustration showing a system 100 and method for making electret media. System 100 has a media receiving zone 108, comprising adjacent rollers 107 and 109, configured for receiving piezoelectric material 102 and a media 104. A media exit zone 112, comprising adjacent rollers 111 and 113, is configured for discharging piezoelectric material 102 and electret media 104a. A media conveying zone 117 is between media receiving zone 108 and media exit zone 112.

The media conveying zone 117 is configured to convey piezoelectric material 102 adjacent media 104 and to at least periodically contact piezoelectric material 102 with media 104. For example, a mover may be configured for moving at least one of the media receiving zone 108, as signified with double arrow a, and media exit zone 112, as signified with double arrow b, closer and away from each other, shortening and lengthening media conveying zone 117. The movement of at least one of the media receiving zone 108 and media exit zone 112, with respect to one another, places a stress on piezoelectric material 102, causing it to generate an electric charge and transfer the generated charge to media 104.

Electret media 104a, exiting media exit zone 112, may be made by placing piezoelectric material 102 adjacent media 104 and applying a mechanical stress to piezoelectric material 102 and thereby transferring an electric charge from piezoelectric material 102 to media 104 and making electret media 104a. For example, piezoelectric material 102 and media 104 may be continuously fed into receiving zone 108, as illustrated with arrows, wherein they become adjacent each other. Cyclically applying the mechanical stress to the fed piezoelectric material 102, with the movement of at least one of media receiving zone 108 and media exit zone 112, enables the system 100 to continuously produce electret media 104a.

Media 104 may be electrically discharged prior to entering receiving zone 108. For example, isopropyl alcohol may be sprayed onto media 104, shown with sprayer 115, electrically discharging media 104 prior to being placed adjacent piezoelectric material 102. Neutralizing the charge of media 104 prior to having a charge transferred thereto, transferred from piezoelectric material 102, may increase or even maximize the resulting charge of electret media 104a.

In at least one embodiment, a charge neutralizing agent, isopropyl alcohol for example, is sprayed onto media 104 prior to being fed to receiving zone 108, with sprayer 115. It may be advantageous to remove any charge neutralizing agent from media 104 prior to being fed to receiving zone 108. For example, isopropyl alcohol applied with sprayer 115 may be evaporated from media 104 prior to being fed to receiving zone 108. In at least one embodiment, suction dryer 119 is configured and disposed to remove the charge neutralizing agent from media 104 prior to being fed between upper roller 107 and lower roller 109.

In at least one embodiment of system 100, piezoelectric material 102 comprises polyvinylidene fluoride. In at least one other embodiment of system 100, media 104 comprises polypropylene. For example, media 104 may be meltblown polypropylene. In at least one further embodiment of the present disclosure, media 104a is an electret filtration media.

Figure 2:
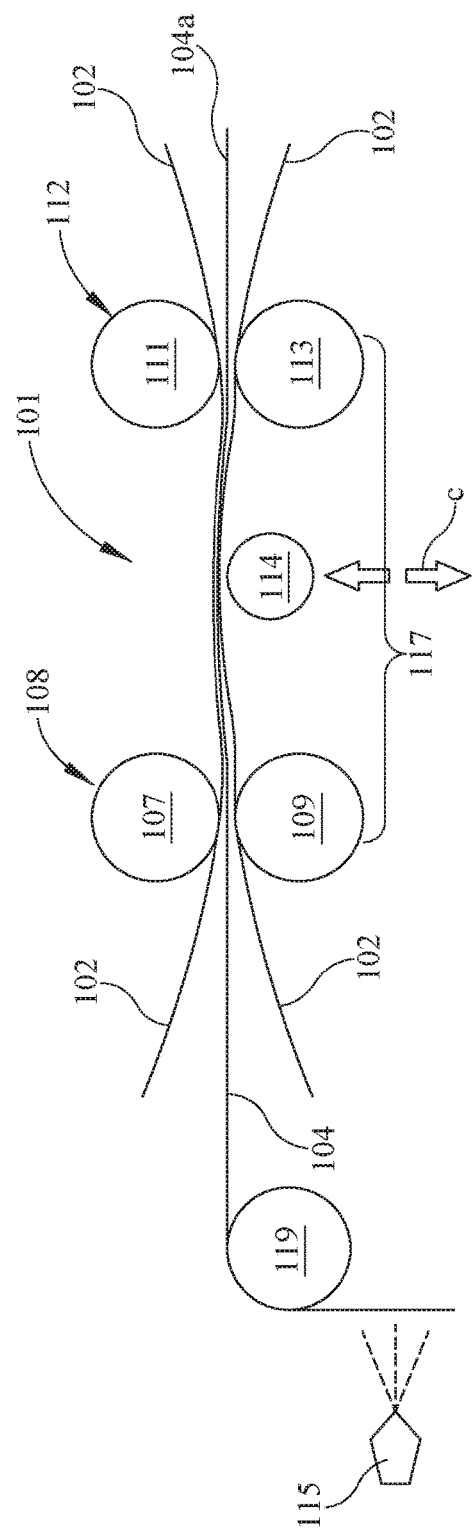
FIG. 2 is an illustration showing another embodiment of a system and method for making electret media.

FIG. 2 is an illustration showing another embodiment of system 101 and a method for making electret media 104a. System 101 may have media receiving zone 108 with adjacent rollers 107 and 109. Media exit zone 112 may have adjacent rollers 111 and 113. For example, electret media 104a may be made by feeding piezoelectric material 102 and media 104, wherein media 104 is configured to accept an electric charge, between a first set of adjacent rollers, having an upper roller 107 adjacent a lower roller 109. Piezoelectric material 102 and media 104 may then be fed between a second set of adjacent rollers, having an upper roller 111 adjacent a lower roller 113, wherein the second set of adjacent rollers are gap spaced from the first set of adjacent rollers, as illustrated with conveying zone 117. A mechanical stress is applied to piezoelectric material 102 which transfers an electric charge from piezoelectric material 102 to media 104, making the electret media 104a.

For example, as shown in FIG. 2, a mechanical stress may be applied to piezoelectric material 102 with an oscillating force to piezoelectric material 102, thus tensioning and relaxing piezoelectric material 102. In at least one embodiment, an oscillator 114 is configured and disposed to provide an oscillating force to piezoelectric material 102 in conveying zone 117 with an up and down movement, as illustrated with arrows c. For example, oscillator 114 may be a roller that moves up and down. In at least one embodiment, the tensioning and the relaxing of piezoelectric material 102 are cyclical and continuous. For example, roller 114 may continuously move up and down. In at least one other embodiment, each cycle of tensioning and the relaxing of piezoelectric material 102 may be between about 12 seconds and about 5 minutes, in increments of a fraction of a second. For example, the cycle of tensioning and relaxation of piezoelectric material 102 may be adjusted for a feed rate of media 104 and piezoelectric material 102 between the rollers. In at least one embodiment, the cycle of tensioning and relaxation of piezoelectric material 102 may be about one minute. In at least one further embodiment, the mechanical stress applied to piezoelectric material 102 does not exceed about 2 mega pascals of stress.

Piezoelectric material 102 is configured to generate an electric charge upon being tensioned and relaxed. For example, piezoelectric material 102 may comprise polyvinylidene fluoride. Piezoelectric material 102 and media 104 may be in the form of sheets of material having similar widths. Media 104 is configured to have an electric charge transferred thereto. In at least one embodiment, media 104 comprises polypropylene. For example, media 104 may be meltblown polypropylene. In at least one further embodiment, media 104 is a filtration media and the resulting product of system 101 is electret filtration media 104*a*.

In at least one embodiment of the present disclosure, piezoelectric material 102 is fed between the rollers above and below media 104, thus contacting an upper surface and a lower surface of media 104. It is to be understood that only a single sheet of piezoelectric material 102 may need be fed into system 101 which may transfer a desired charge to media 104. For example, in at least one other embodiment, a single sheet of piezoelectric material 102 is fed into conveying zone 117 above or below media 104.

As illustrated with the arrows on media 104 and piezoelectric material 102, piezoelectric material 102 and media 104 may be continuously fed between the two sets of rollers, rollers 107 and 109, and rollers 111 and 113, making a continuous process for making electret media 104*a*. In at least one embodiment, media 104 and piezoelectric material 102 are fed at substantially the same rate.

Media 104 may have a substantially a neutral charge prior to being fed between the two sets of rollers, at receiving zone 108 and exit zone 112. For example, media 104 may be electrically discharged prior to being fed to receiving zone 108. In at least one embodiment, isopropyl alcohol is sprayed onto media 104 prior to being fed to receiving zone 108, with sprayer 115 for example. It may be advantageous to remove any charge neutralizing agent from media 104 prior to being fed to receiving zone 108. For example, isopropyl alcohol applied with sprayer 115 may be evaporated from media 104 prior to being fed to receiving zone 108. In at least one embodiment, suction dryer 119 is configured and disposed to remove the charge neutralizing agent, such as isopropyl alcohol, from media 104 prior to being fed between upper roller 107 and lower roller 109.

Figure 3:
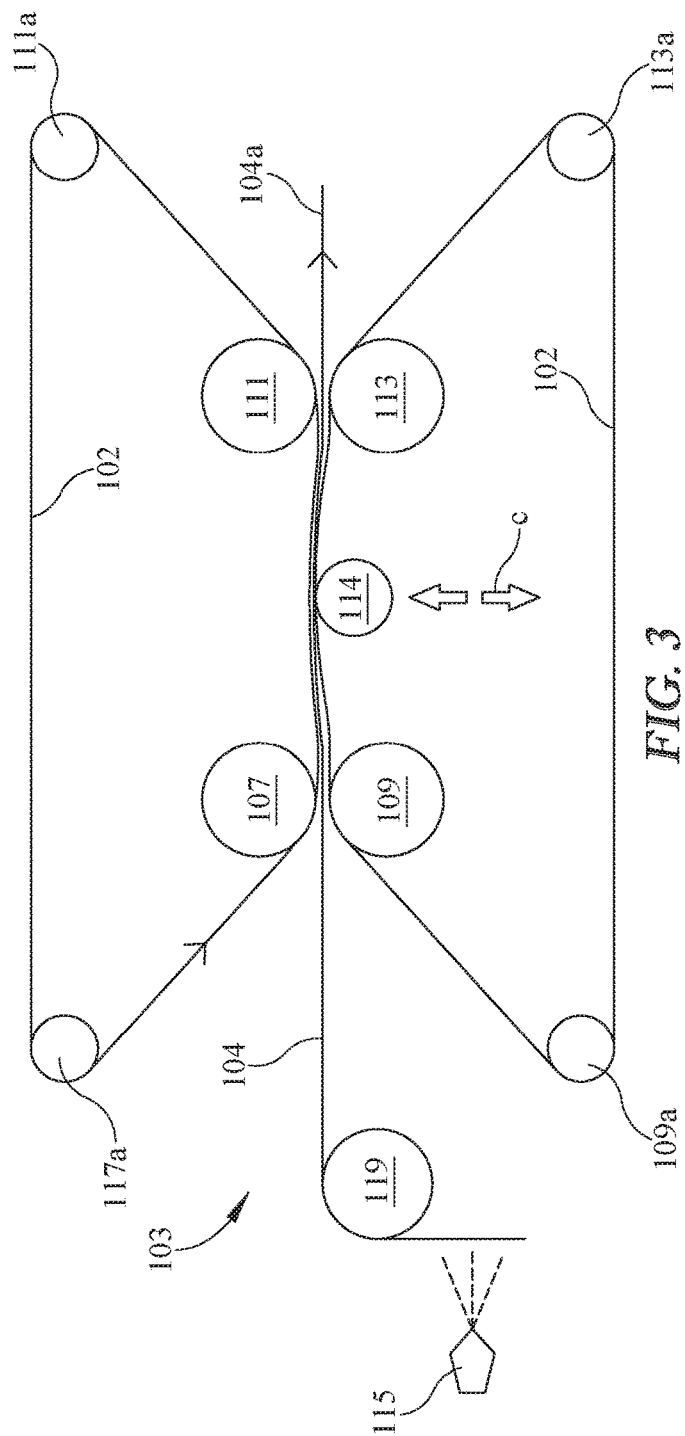
FIG. 3 is an illustration showing a further embodiment of a system and method for making electret media.

FIG. 3 shows system 103 and a method for making electret media 104*a*. System 103 may have adjacent rollers 107 and 109 for receiving media 104 and piezoelectric material 102. Media 104 and piezoelectric material 102 may be fed through adjacent rollers 111 and 113. For example, electret media 104*a* may be made by feeding piezoelectric material 102 and media 104, wherein media 104 is configured to accept an electric charge, between a first set of adjacent rollers, having an upper roller 107 adjacent a lower roller 109. Piezoelectric material 102 and media 104 may then be fed between a second set of adjacent rollers, having an upper roller 111 adjacent a lower roller 113, wherein the second set of adjacent rollers are gap spaced from the first set of adjacent rollers. A mechanical stress is applied to piezoelectric material 102. Piezoelectric material 102 is configured to transfer an electric charge to media 104 and make electret media 104*a*.

For example, as shown in FIG. 3, a mechanical stress may be applied to piezoelectric material 102 with an oscillating force to piezoelectric material 102, thus tensioning and relaxing piezoelectric material 102. In at least one embodiment, an oscillator 114 is configured and disposed to provide an oscillating force to piezoelectric material 102 with an up and down movement, as illustrated with arrows c. For example, oscillator 114 may be a roller that moves up and down.

Piezoelectric material 102 is configured to generate an electric charge upon being tensioned and relaxed and media 104 is configured to have the generated electric charge transferred thereto. As illustrated with the arrows on media 104 and piezoelectric material 102, piezoelectric material 102 and media 104 may be continuously fed between the two sets of rollers, rollers 107 and 109, and rollers 111 and 113, making a continuous process for making electret media 104*a*. In at least one embodiment, media 104 and piezoelectric material 102 are fed at substantially the same rate.

In at least one embodiment, piezoelectric material 102 is fed from adjacent rollers 111 and 113 and back to adjacent rollers 107 and 109. For example, one sheet of piezoelectric material 102 may be fed from adjacent rollers 111 and 113, around rollers 111*a* and 117*a*, and back to adjacent rollers 107 and 109. A second sheet of piezoelectric material 102 may be fed from adjacent rollers 111 and 113, around rollers 113*a* and 109*a*, and back to adjacent rollers 107 and 109.

Media 104 may be electrically discharged prior to being fed between upper roller 107 and lower roller 109. For example, isopropyl alcohol may be sprayed onto media 104, shown with sprayer 115, electrically discharging media 104 prior to being placed adjacent piezoelectric material 102. Neutralizing the charge of media 104 prior to having a charge transferred thereto, transferred from piezoelectric material 102, may increase or even maximize the resulting charge of electret media 104*a*. It may be advantageous to remove any charge neutralizing agent from media 104 prior to being fed to receiving zone 108. For example, isopropyl alcohol applied with sprayer 115 may be removed with suction dryer 119, prior to media 104 being fed between upper roller 107 and lower roller 109.

Figure 4:
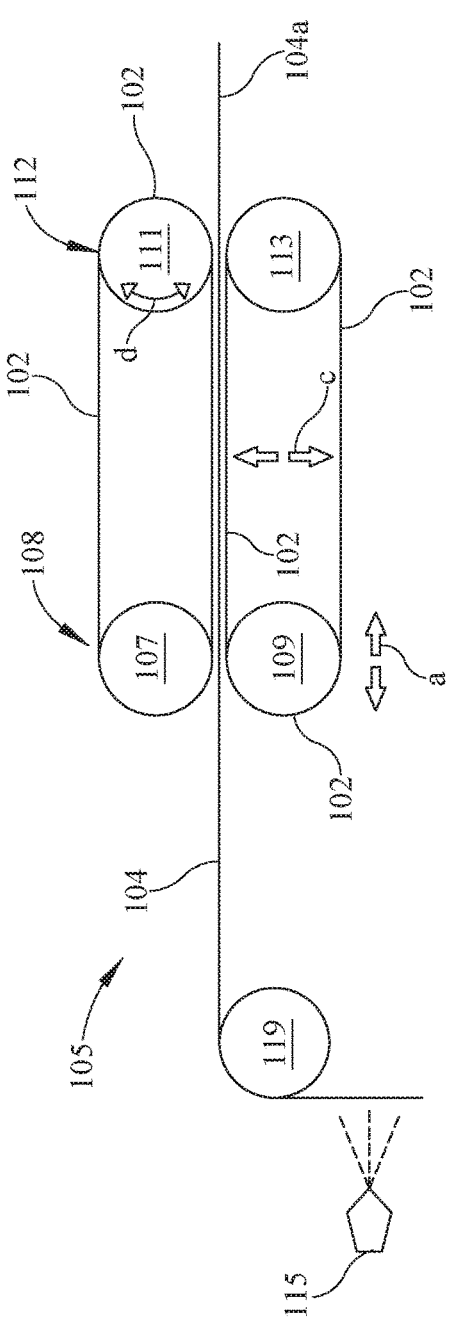
FIG. 4 is an illustration showing further embodiments of the system and method for making electret media.

FIG. 4 is an illustration showing system 105 and a method for making electret media 104*a*. As shown in this example, piezoelectric material 102 may be in the form of a belt. For example, a belt of piezoelectric material 102 may be wrapped around both of the upper rollers, 107 and 111, and/or both of the lower rollers, 109 and 113, of the first set of adjacent rollers, in receiving zone 108, and the second set of adjacent rollers, in exit zone 112.

System 105 illustrates several different methods and means for applying a mechanical stress to piezoelectric material 102. For example, a mechanical stress may be applied to piezoelectric material 102 with an oscillator, illustrated with double arrow c, configured for applying an oscillating force to piezoelectric material 102 and tensioning and relaxing piezoelectric material 102. A mover, illustrated with double arrow a, may be configured and disposed for moving at least one of the media receiving zone 108 and the media exit zone 112 closer and away from each other, shortening and lengthening the media conveying zone 117. A rate changing apparatus, illustrated with double headed arrow d, may be configured to change the rate of at least one of the rate of electret media 102 being received in receiving zone 108 and the discharge rate of the electret media 102, being discharged from exit zone 112. For example, one of upper rollers 107 and 111 may have a rotational speed changing in comparison with the rotational speed of the other upper roller, causing tensioning and relaxing of the upper belt of piezoelectric material 102. In another example, one of lower rollers 109 and 113 may have a rotational speed changing in comparison with the rotational speed of the other lower roller, causing tensioning and relaxing of the lower belt of piezoelectric material 102.

Media 104 may be electrically discharged prior to being fed between upper roller 107 and lower roller 109. For example, a charge neutralizing agent such as isopropyl alcohol may be sprayed onto media 104, shown with sprayer 115, electrically discharging media 104 prior to being placed adjacent piezoelectric material 102. It may be advantageous to remove any charge neutralizing agent from media 104 prior to being fed to receiving zone 108. For example, a charge neutralizing agent applied with sprayer 115 may be removed with suction dryer 119, prior to media 104 being fed between upper roller 107 and lower roller 109.

It is to be understood that other and different methods and means may be used to tension and relax piezoelectric material 102. It is also to be understood that more than one method or a combination of methods, for tensioning and relaxing piezoelectric material 102 may be incorporated in the presently disclosed system and method for making electret media 104a.

Example

Electret media was made by continuously feeding a layer of meltblown polypropylene (PP MB) between two layers of meltblown Polyvinylidene Fluoride, (PVDF MB). The three layers were fed between two sets of rollers. The layers were placed under tension and then relaxed. Each cycle of tension and relaxation was approximately 1 minute or 30 seconds of increasing tension and 30 seconds of decreasing tension or relaxation. A maximum of 2 mega pascals of stress on the MB PVDF was not exceeded during tension. The sets of rollers were spaced about 0.5 m apart and the feed rate of the layers was about 15 m/min, providing a time of about 2 seconds between the two sets of rollers.

The weight of the PP MB was about 20 gram/sq. m and had a thickness of about 0.25 mm. The weight of the PVDF MB was about 70 gram/sq. m and had a thickness of about 0.2 mm.

Electric surface charge measurements were taken on the PP MB and PVDF MB with a Monroe 244 Electrostatic Voltmeter with Miniature Electrostatic Probe, model 1017A/1034. A charge measurement was taken on the PP MB. The PP MB was discharged by spraying with isopropyl alcohol, IPA, and a charge measurement was taken prior to feeding between the rollers. A charge measurement was taken on the PVDF prior to feeding between the rollers. A charge measurement was taken on the PP MB after exiting the second set of rollers. The results are tabulated below wherein the charge measurements show the measured electrostatic field strength in Volts.

TABLE 1

| | Distance width of MB Web (cm) | | | | | | | | |
|---|---|---|---|---|---|---|---|---|---|
| | 5 | 10 | 15 | 20 | 25 | 30 | 35 | 40 | AV. |
| PP MB eletric charged | 240 | 405 | 225 | −67 | 270 | 350 | 373 | 270 | 258 |
| PP MB eletric charge removed with IPA | 3 | −7 | 10 | 3 | −2 | 4 | 6 | −5 | 1.5 |
| PVDF original electric charge | −405 | −809 | −1400 | −990 | −640 | −711 | −938 | −1205 | −887 |
| PVDF Piezo electric charge build up on PP MB | 423 | 538 | 340 | 450 | 690 | 440 | 550 | 325 | 470 |

In TABLE 1, the distance width of MB web signifies a distance in centimeters from an edge of the web where the charge measurement was taken, the webs had about width of about 45 cm. PP MB electric charged signifies the charge recorded on the PP MB prior to discharging. PP MB electric charge removed with IPA signifies the charge recorded on the PP MB after discharging with IPA. PVDF original electric charge signifies the charge on the PVDF MB prior to being fed between the two sets of rollers. PVDF Piezoelectric charge build up on PP MB shows the charge of the PP MB after passing between the two sets of rollers.

The above data shows that the presently disclosed process transfers a substantial charge to the PP MB. TABLE 1 shows that the presently disclosed method and system imparted an average of about 470 volts to the PP MB having a negligible charge upon entering the system.

A sample of the 20 gram/sq. m PP MB was charge without neutralizing the charge of the PP MB with IPA prior to being fed into the system. The amount of charge transfer without IPA discharge was found to be about 400 volts. With an average starting charge of about 258 volts, it is shown that the neutralizing of the PP MB prior to being fed into the system may not be required to achieve a desired charge transfer.

Having thus disclosed embodiments and aspects of the presently disclosed system and method for making electret media, it is to be understood that the accompanying claims are not to be limited by the selected embodiments and aspects of the present disclosure. For example, a system for making electret media need only be configured to place a piezoelectric material adjacent a media and apply a mechanical stress to the piezoelectric material and thereby transfer an electric charge from the piezoelectric material to the media and make the electret media. The presently disclosed system may not require zones or rollers as disclosed in the selected embodiments herein and the claims shall not be limited to the presently disclosed embodiments.

In at least one embodiment of the presently disclosed system and method, media may be recharged. For example, charged filtration media may become electrically discharged over time and the presently disclosed process may electrically recharge the filtration media.

One feature or aspect of an embodiment is believed at the time of the filing of this patent application to possibly reside broadly in a method of making electret media comprising the steps of: feeding a piezoelectric material and a media configured to accept an electric charge between a first set of adjacent rollers, having an upper roller adjacent a lower roller; feeding the piezoelectric material and the media configured to accept an electric charge between a second set of adjacent rollers, having an upper roller adjacent a lower roller, wherein the second set of adjacent rollers are gap spaced from the first set of adjacent rollers; and applying a mechanical stress to the piezoelectric material and thereby transferring an electric charge from the piezoelectric material to the media and making the electret media.

Another feature or aspect of an embodiment is believed at the time of the filing of this patent application to possibly reside broadly in a method of making electret media, wherein the piezoelectric material is configured to generate an electric charge upon being tensioned and relaxed.

Yet another feature or aspect of an embodiment is believed at the time of the filing of this patent application to possibly reside broadly in a method of making electret media, wherein the piezoelectric material comprises polyvinylidene fluoride.

Still another feature or aspect of an embodiment is believed at the time of the filing of this patent application to possibly reside broadly in a method of making electret media, wherein the media comprises polypropylene.

A further feature or aspect of an embodiment is believed at the time of the filing of this patent application to possibly reside broadly in a method of making electret media, wherein the media is meltblown polypropylene.

Another feature or aspect of an embodiment is believed at the time of the filing of this patent application to possibly reside broadly in a method of making electret media, wherein the media is a filtration media.

Yet another feature or aspect of an embodiment is believed at the time of the filing of this patent application to possibly reside broadly in a method of making electret media, wherein the piezoelectric material is fed between the rollers above and below the media, thus contacting an upper surface and a lower surface of the media.

Still another feature or aspect of an embodiment is believed at the time of the filing of this patent application to possibly reside broadly in a method of making electret media, wherein the piezoelectric material and media are continuously fed between the two sets of rollers at substantially the same rate.

A further feature or aspect of an embodiment is believed at the time of the filing of this patent application to possibly reside broadly in a method of making electret media, wherein the media has substantially a neutral charge prior to being fed between the two sets of rollers.

Another feature or aspect of an embodiment is believed at the time of the filing of this patent application to possibly reside broadly in a method of making electret media further comprising a step of discharging the media with isopropyl alcohol prior to being fed between the two sets of rollers.

Yet another feature or aspect of an embodiment is believed at the time of the filing of this patent application to possibly reside broadly in a method of making electret media, wherein the mechanical stress is applied to the piezoelectric material by at least one of a-c, wherein a-c are: a. applying an oscillating force to the piezoelectric material and tensioning and relaxing the piezoelectric material; b. moving the first set of rollers away from the second set of rollers, thereby tensioning the piezoelectric material, and moving the first set of rollers toward the second set of rollers, thereby relaxing piezoelectric material; and c. changing a rotational speed of at least one of the rollers and tensioning and relaxing the piezoelectric material.

One feature or aspect of an embodiment is believed at the time of the filing of this patent application to possibly reside broadly in a method of making electret media, wherein the tensioning and the relaxing of the piezoelectric material is cyclical and continuous.

Another feature or aspect of an embodiment is believed at the time of the filing of this patent application to possibly reside broadly in a method of making electret media, wherein each cycle of tensioning and the relaxing of the piezoelectric material is between about 12 seconds and about 5 minutes.

Yet another feature or aspect of an embodiment is believed at the time of the filing of this patent application to possibly reside broadly in a method of making electret media, wherein the mechanical stress applied to the piezoelectric material does not exceed 2 mega pascals of stress.

Still another feature or aspect of an embodiment is believed at the time of the filing of this patent application to possibly reside broadly in a method of making electret media, wherein piezoelectric material is in the form of a belt and the belt of piezoelectric material is wrapped around both of the upper or both of the lower rollers of the first set of adjacent rollers and the second set of adjacent rollers.

A further feature or aspect of an embodiment is believed at the time of the filing of this patent application to possibly reside broadly in a method of making electret media comprising the steps of: placing a piezoelectric material adjacent a media; and applying a mechanical stress to the piezoelectric material and thereby transferring an electric charge from the piezoelectric material to the media and making the electret media.

Another feature or aspect of an embodiment is believed at the time of the filing of this patent application to possibly reside broadly in a method of making electret media further comprising the steps of: continuously feeding the piezoelectric material and the media adjacently each other; and cyclically applying the mechanical stress to the fed piezoelectric material.

Yet another feature or aspect of an embodiment is believed at the time of the filing of this patent application to possibly reside broadly in a method of making electret media further comprising a step of discharging the media prior to being placed adjacent the piezoelectric material.

Still another feature or aspect of an embodiment is believed at the time of the filing of this patent application to possibly reside broadly in a method of making electret media, wherein the piezoelectric material comprises polyvinylidene fluoride.

A further feature or aspect of an embodiment is believed at the time of the filing of this patent application to possibly reside broadly in a method of making electret media, wherein the media comprises polypropylene.

Another feature or aspect of an embodiment is believed at the time of the filing of this patent application to possibly reside broadly in a system configured for making electret media comprising: a media receiving zone configured for receiving a piezoelectric material and a media; a media exit zone configured for discharging the piezoelectric material and the media; a media conveying zone between the media receiving zone and the media exit zone; the media conveying zone being configured to convey the piezoelectric material adjacent the media and to at least periodically contact the piezoelectric material with the media; and at least one of a-c, wherein a-c are: a. an oscillator configured for applying an oscillating force to the piezoelectric material and tensioning and relaxing the piezoelectric material; b. a mover configured for moving at least one of the media receiving zone and the media exit zone closer and away from each other, shortening and lengthening the media conveying zone; and c. a rate changing apparatus configured to change the rate of at least one of the rate of the electret media being received in the receiving zone and the discharge rate of the electret media being discharged from the exit zone.

The invention claimed is:

1. A method of making electret media comprising the steps of:
   feeding a piezoelectric material and a media configured to accept an electric charge between a first set of adjacent rollers, having an upper roller adjacent a lower roller;
   feeding the piezoelectric material and the media configured to accept an electric charge between a second set of adjacent rollers, having an upper roller adjacent a lower roller, wherein the second set of adjacent rollers are gap spaced from the first set of adjacent rollers; and
   applying a mechanical stress to the piezoelectric material and thereby transferring an electric charge from the piezoelectric material to the media and making the electret media.

2. The method of claim 1, wherein the piezoelectric material is configured to generate an electric charge upon being tensioned and relaxed.

3. The method of claim 1, wherein the piezoelectric material comprises polyvinylidene fluoride.

4. The method of claim 1, wherein the media comprises polypropylene.

5. The method of claim 4, wherein the media is meltblown polypropylene.

6. The method of claim 1, wherein the media is a filtration media.

7. The method of claim 1, wherein the piezoelectric material is fed between the rollers above and below the media, thus contacting an upper surface and a lower surface of the media.

8. The method of claim 1, wherein the piezoelectric material and media are continuously fed between the two sets of rollers at substantially the same rate.

9. The method of claim 1, wherein the media has substantially a neutral charge prior to being fed between the two sets of rollers.

10. The method of claim 9, further comprising a step of discharging the media with isopropyl alcohol prior to being fed between the two sets of rollers.

11. The method of claim 1, wherein the mechanical stress is applied to the piezoelectric material by at least one of a-c, wherein a-c are:
   a. applying an oscillating force to the piezoelectric material and tensioning and relaxing the piezoelectric material;
   b. moving the first set of rollers away from the second set of rollers, thereby tensioning the piezoelectric material, and moving the first set of rollers toward the second set of rollers, thereby relaxing piezoelectric material; and
   c. changing a rotational speed of at least one of the rollers and tensioning and relaxing the piezoelectric material.

12. The method of claim 11, wherein the tensioning and the relaxing of the piezoelectric material is cyclical and continuous.

13. The method of claim 12, wherein each cycle of the tensioning and the relaxing of the piezoelectric material is between about 12 seconds and about 5 minutes.

14. The method of claim 1, wherein the mechanical stress applied to the piezoelectric material does not exceed 2 mega pascals of stress.

15. The method of claim 1, wherein piezoelectric material is in the form of a belt and the belt of piezoelectric material is wrapped around both of the upper or both of the lower rollers of the first set of adjacent rollers and the second set of adjacent rollers.

16. A system configured for making electret media comprising:
   a media receiving zone configured for receiving a piezoelectric material and a media;
   a media exit zone configured for discharging the piezoelectric material and the media;
   a media conveying zone between the media receiving zone and the media exit zone;
   the media conveying zone being configured to convey the piezoelectric material adjacent the media and to at least periodically contact the piezoelectric material with the media; and
   at least one of a-c, wherein a-c are:
      a. an oscillator configured for applying an oscillating force to the piezoelectric material and tensioning and relaxing the piezoelectric material;
      b. a mover configured for moving at least one of the media receiving zone and the media exit zone closer and away from each other, shortening and lengthening the media conveying zone; and
      c. a rate changing apparatus configured to change the rate of at least one of a rate of the electret media being received in the receiving zone and a discharge rate of the electret media being discharged from the exit zone.

17. The system of claim 16, wherein the media receiving zone and the media exit zone each comprise an upper drum and a lower drum, and the drums are configured and disposed to adjacently convey the piezoelectric material and the media through the media conveying zone.

18. The system of claim 16, further comprising an electric charge neutralizer configured and disposed to neutralize an electric charge of the media, prior to the media being received by the media receiving zone.

19. The system of claim 18, wherein the electric charge neutralizer comprises a sprayer and an evaporator or suction device, the sprayer being configured and disposed to spray a neutralizing agent onto the media and the evaporator or suction device being configured and disposed to remove the neutralizing agent sprayed onto the media.

20. The system of claim 16, being configured to convey a sheet of the piezoelectric material adjacent an upper surface of the media and a sheet of the piezoelectric material adjacent a lower surface of the media, through the media conveying zone.

21. The system of claim 16, wherein the piezoelectric material is in the form of a loop and the receiving zone is configured to receive the piezoelectric material exiting the exit zone.

* * * * *